(12) United States Patent
Kenington

(10) Patent No.: US 6,714,072 B2
(45) Date of Patent: Mar. 30, 2004

(54) DISTORTION REDUCTION

(75) Inventor: Peter Kenington, Chepstow (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/148,869

(22) PCT Filed: Dec. 1, 2000

(86) PCT No.: PCT/GB00/04596
§ 371 (c)(1),
(2), (4) Date: Sep. 30, 2002

(87) PCT Pub. No.: WO01/41297
PCT Pub. Date: Jun. 7, 2001

(65) Prior Publication Data
US 2003/0107436 A1 Jun. 12, 2003

(30) Foreign Application Priority Data
Dec. 3, 1999 (GB) .............................. 9928720

(51) Int. Cl.$^7$ ............................... H03F 1/26
(52) U.S. Cl. .................... 330/149; 330/124 R; 330/151
(58) Field of Search .............................. 330/124 R, 149, 330/151

(56) References Cited
U.S. PATENT DOCUMENTS 4,453,133 A 6/1984 Travis
4,629,996 A * 12/1986 Watanabe et al. ........... 330/151

* cited by examiner

Primary Examiner—Steven J. Mottola
(74) Attorney, Agent, or Firm—Steve Mendelsohn

(57) ABSTRACT

The input signal (110) to a non-linear amplifier (112) is predistorted by injecting a correction signal at coupler (124). To generate the correction signal, a sample of the input signal is amplified using amplifier (130) which has substantially the same distortion generating characteristics as amplifier (112). The output of amplifier (130) is sampled, and the main tone energy is removed at (138), leaving the correction signal for injection to the main signal path. The main portion of the output of amplifier (130) is added coherently to the output of amplifier (112) to enhance efficiency. The correction signal can be manipulated to correct distortion in the output of combiner (152) due to the main portion of the output of amplifier (130).

13 Claims, 4 Drawing Sheets

DISTORTION REDUCTION

The invention relates to methods and apparatus for reducing the distortion appearing in an amplified output signal. In particular, the invention relates to reducing distortion by predistorting an input signal.

It is known to predistort the input signal to an amplifier to counter distortion imposed on the input signal by the amplifier. This makes the amplifier output assume a more linear relationship to the input signal. There are several known predistortion techniques for countering intermodulation distortion (IMD) imposed upon a signal by an amplifier.

One such predistortion technique comprises removing a sample of the input signal (prior to amplification) and mixing it into itself repeatedly to produce components whose frequencies correspond to the frequencies of intermodulation distortion appearing in the output of the amplifier. These components are injected into the input signal to predistort it in such a way as to counter the intermodulation distortion imposed on it by the amplifier. It will be appreciated that the components produced by the predistortion signal by mixing the input signal sample into itself repeatedly only approximately mimic the IMD produced by the amplifier. Hence, IMD cancellation by this predistortion technique is imperfect.

A second known technique for predistorting the input to an amplifier comprises the input signal through it. The output of the low power amplifier should therefore contain components whose frequencies correspond to the IMD created by the main amplifier operating on the main component of the input signal. These components can then be injected into the input signal to the main amplifier as a controllable predistortion. However, it will be appreciated that, again, the predistortion signal only approximately mimics the IMD characteristics of the main amplifier because the low power amplifier constructed will not have distortion characteristics which match perfectly those of the main amplifier.

It is an object of the invention to provide a predistortion which accurately mimics the distortion characteristics of an amplifier which it is desired to linearise.

It is another object of the invention to provide a predistortion in a power-efficient manner. According to a first aspect, the invention provides a method of reducing the distortion appearing in an amplified output signal, the method comprising the steps of: sampling a portion of an input signal destined for amplification by a first amplification process; amplifying the sample signal using a second amplification process whose distortion characteristics are at least similar to those of the first amplification process to produce an amplified sample signal; extracting a distortion signal from the amplified sample signal; combining the distortion signal with the input signal destined for amplification by the first amplification process to reduce distortion of its output; and combining the output of the first and second amplification processes to produce the amplified output signal; wherein the step of extracting a distortion signal comprises the steps of sampling the amplified sample signal and removing the amplified input signal appearing in this sample.

According to a second aspect, the invention provides apparatus for reducing the distortion appearing in an amplified output signal, the apparatus comprising means for sampling a portion of the input signal destined for amplification by a first amplification means, second amplification means for amplifying the sample signal, to produce an amplified sample signal, the distortion characteristics of the second amplification means being at least similar to those of the first amplification means, means for extracting a distortion signal from the amplified sample signal, means for combining the distortion signal with the input signal destined for amplification by the first amplification means to reduce distortion of its output, and means for combining the outputs of the first and second amplification means to produce the amplified output signal; wherein the extracting means comprises means for sampling the amplified sample signal and means for removing the amplified input signal appearing in this sample.

The invention thus provides that the power present in the output of the second amplification process is not wasted but forms part of the output signal, thereby enhancing efficiency. Furthermore, this makes it practical for the second amplification process to be a relatively high output power process, like the first (main) amplification process, which means that the distortion characteristics of the two amplification processes can match one another more accurately.

In a preferred embodiment, the first and second amplification processes are implemented by amplifiers which are identical to one another. In a variation on this embodiment, the main amplifier comprises a number of amplification modules, which are identical to one another, operating in parallel on the input signal and the second amplification process (which creates the distortion signal for the predistortion process) comprises a smaller number of amplification modules of the aforementioned type operating in parallel. The arrangements used in these embodiments provide that the distortion characteristics of the two amplification processes match very well.

The extracted distortion signal is subjected to amplitude and phase adjustment to ensure maximum cancellation of distortion in the output signal of the first (and, possibly, also in the second) amplification process. This allows the system to be adjusted as the distortion characteristics of the amplification processes vary over time, due, for example, to ageing and/or temperature variations.

In a preferred embodiment, the invention provides for the input signal to the first (main) amplification process to be predistorted in such a way as to overcorrect the output signal of the first amplification process in a controlled manner. The benefit of doing this is that the controlled distortion in the output of the first amplification process can be arranged to cancel distortion present in the output of the second amplification process with which it is combined, thereby leading to a more linear overall output signal.

By way of example only, the invention will now be described with reference to the accompanying drawings, in which.

Figure 1:
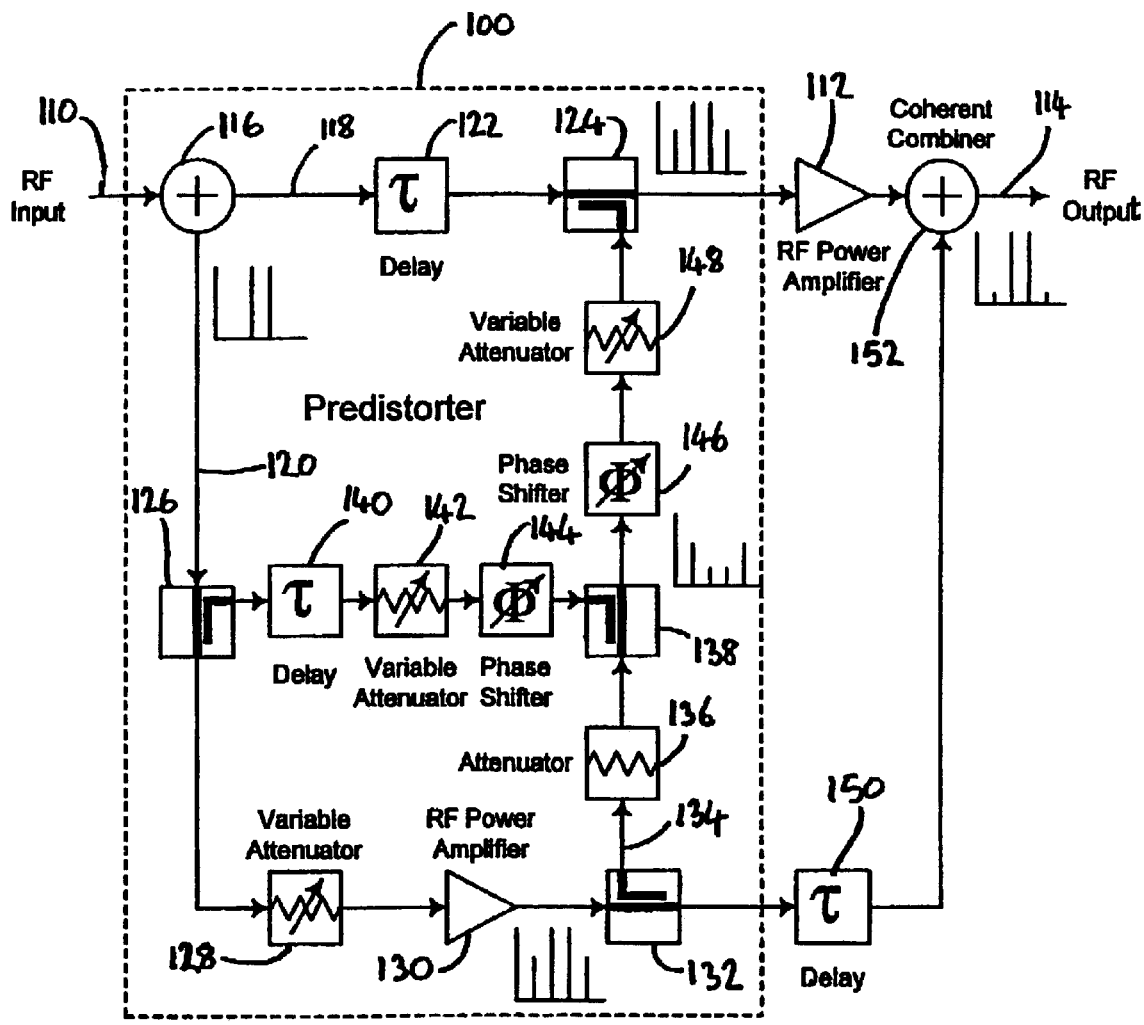
FIG. 1 illustrates a scheme for linearising an RF power amplifier.

The predistorter 100 shown in FIG. 1 is arranged to predistort the RF input 110 to non-linear RF power amplifier 112 so that IMD is suppressed in the RF output 114 of the system.

In the predistorter 100, splitter 116 divides the RF input 110 to form a main signal path 118 and a non-linear signal path 120. The main signal path 118 contains a time delay 122 which delays the signal by an appropriate amount to allow it to recombine, in the correct time-aligned manner, with a correction signal at combiner 124. The output of combiner 124 is the predistorted input signal for amplifier 112. The creation of the correction signal injected at combiner 124 will now be described.

In the non-linear signal path 120, the input signal passes through splitter 126 (where a portion of the input signal is removed for a purpose which will be described later) and variable attenuator 128 to RF power amplifier 130.

Amplifier 130 is identical to the amplifier 112 whose input undergoes predistortion. The advantage of using identical amplifiers is that that they will form a near perfect pair from the linearisation perspective. Their characteristics should also track well with temperature, drive level, etc., hence resulting in a good level of linearity improvement across a wide range of operation conditions. The two identical amplifiers are, for example, identical power amplifier modules, operating at identical power levels (such as would normally be combined to form a single amplifier) with one of them now acting as a predistorter for the other. To ensure that the IMD characteristics of the amplifiers 112 and 130 are as similar as possible, they can be mounted as close to one another as possible, and preferably mounted on the same heat sink so that they will operate under the same environmental conditions. A portion of the output of amplifier 130 is removed at splitter 132 and is directed along injection path 134.

The amplified version of the input signal 110 on path 134 contains a significant main signal component (corresponding to the input signal itself) in addition to the intermodulation products, and this main signal component must be cancelled in the injection path 134. However, the signal required for predistortion is very low in level, and therefore the injection path signal is attenuated by attenuator 136. The main signal component is then removed from the attenuated injection path signal at directional coupler 138 which introduces a cancellation signal for cancelling the main signal component. The cancellation signal is the portion of the input signal which is removed at splitter 126. The signal removed at this splitter is subjected to a time delay 140 (which ensures that the signals recombine at directional coupler 138 in the correct time-aligned manner). The time delayed signal is then adjusted in both amplitude and phase to ensure that it cancels the main signal component in the injection path signal. The amplitude and phase adjustments are performed by variable attenuator 142 and variable phase shifter 144, respectively.

The signal emerging from directional coupler 138 is the correction signal and consists substantially of the intermodulation products created by amplifier 130 (which will match the IMD components created by amplifier 112), with the majority of the main signal energy eliminated. This signal is then adjusted in both phase and amplitude prior to combination with the input signal in the main signal path 118 at combiner 124. The phase and amplitude adjustments of the distortion signal are performed by variable phase shifter 146 and variable attenuator 148 respectively, which ensure that the correction signal introduced at coupler 124 contains IMD components which are appropriately adjusted to cancel the distortion produced within amplifier 112.

At splitter 132, only a small portion of the output of amplifier 130 is directed into the injection path 134. The bulk of the output of amplifier 130 is subjected to time delay 150 and then combined with the output of amplifier 112 at coherent combiner 152. Time delay 150 ensures that the signals recombine at coherent combiner 114 in the correct time-aligned manner. Combiner 152 is, for example, a hybrid or Wilkinson combiner. The output of amplifier 130 thus contributes to the overall power output of the system. The only losses are those associated with the sampling coupler 132 and the time delay element 150, both of which are small.

The output of amplifier 130 which is supplied to combiner 152 will contain IMD products. Since amplifiers 112 and 130 are near identical, their IMD products and levels will also be near identical. These signals will therefore combine coherently at 152, creating a single distortion product at each frequency which is similar to the relevant IMD product of each amplifier individually. To cancel this additional distortion in the summed output, the predistorter 100 is adjusted to effectively slightly overcorrect the distortion produced by amplifier 112 so that the distortion in the output of amplifier 130 is cancelled when the signals are combined at combiner 152.

The variable attenuator 128 placed prior to the amplifier 130 in the non-linearity path 120 is used to ensure that the drive levels applied to both amplifiers 112 and 130 are identical, thereby ensuring that their non-linear transfer functions are being operated at the same point. The setting of attenuator 128 should not need to be controlled and may be adjusted and fixed upon manufacture.

It is possible to omit time delay 150 from the system. Time delay 150 has two functions.

First, it ensures that the two main signals at combiner 152 combine coherently, thus minimising combining losses. However, the allowable phase error can become quite large (ten degrees or more) before significant efficiency is lost and hence time delay accuracy (or even the presence of a time delay element at all) is, relatively speaking, not critical to the operation of the system, at least from this viewpoint. Second, the time delay 150 ensures that the IMD products combine coherently at combiner 152, thus ensuring that a known IMD phase versus frequency characteristic results (and hence provides that the predistorter operation is broadband). From this point of view, the accuracy of the time alignment of the signals being combined at combiner 152 determines the degree of broadband IMD cancellation which may be achieved and is therefore more critical.

Where the input signal is a single carrier signal occupying a relatively narrow bandwidth, the delay element 150 may be dispensed with altogether. For wider bandwidth input signals, the delay element 150 may still be omitted, and the effects countered by altering the delay introduced by time delay element 122 within predistorter 100. Therefore, losses due to the high power delay element 150 can be removed and the overall system efficiency can be almost identical to that of an unlinearised power amplifier constructed by combining the two power amplifiers 112 and 130 and driving them at the same level.

It is possible to extend the principles demonstrated in the system of FIG. 1 to multiple, combined, amplifier modules. A typical high power RF amplifier will consist of a number of separate amplifiers combined to reach the desired output power (due to power limitations in available single transistors). The system of FIG. 1 can be adapted in several ways to incorporate such combined amplifiers.

Figure 2:
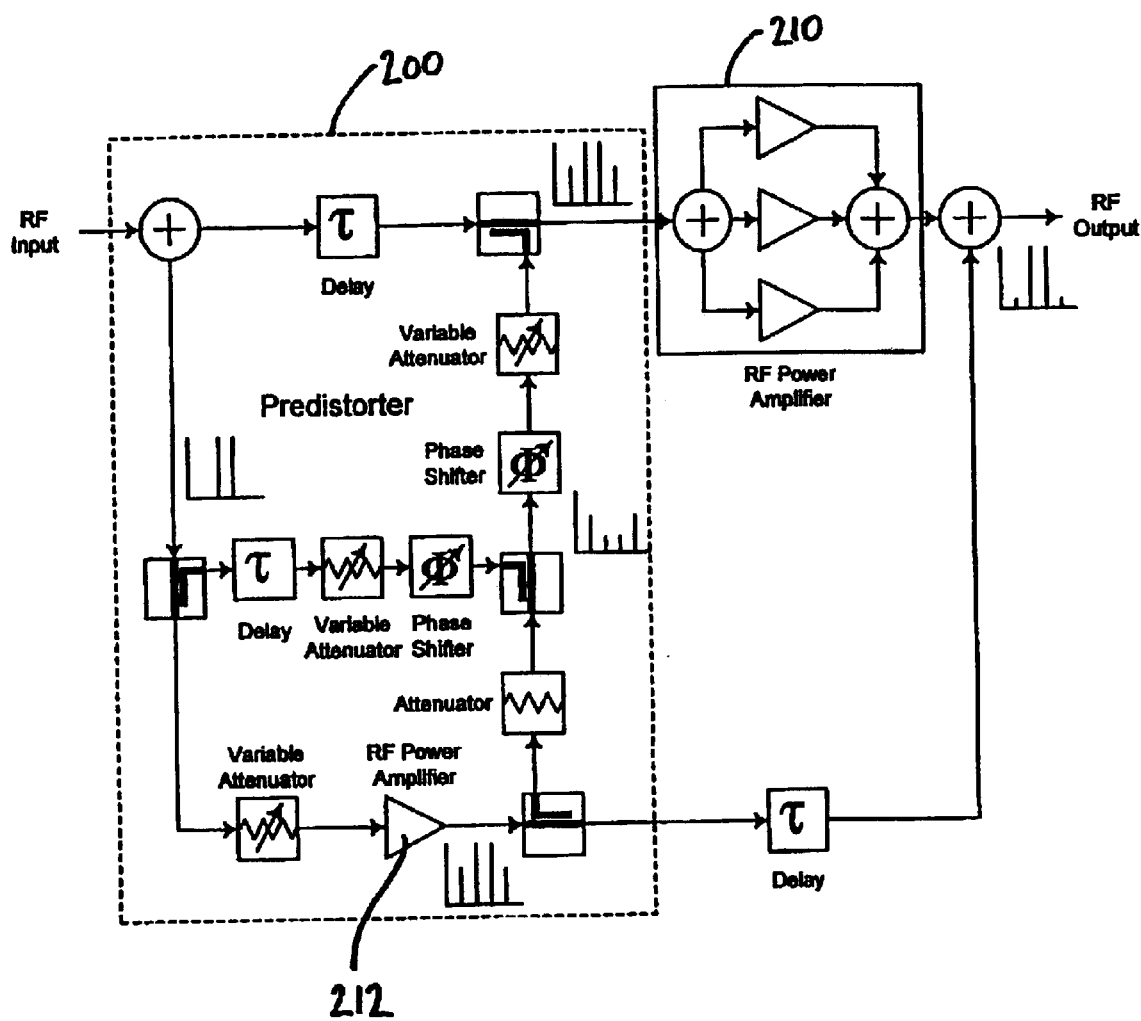
FIG. 2 illustrates a further scheme for linearising an RF power amplifier.

The predistorter 200 shown in FIG. 2 is similar to that described with reference to FIG. 1, and only the significant differences will now be described. In the system shown in FIG. 2, the amplifier 210 in the main signal path comprises three identical amplifier modules operating in parallel on the input signal. Their amplified outputs are combined to produce the output of the amplifier 210. The amplifier 212 used within predistorter 200 to produce the correction signal corresponds to a single one of the amplifier modules within amplifier 210. However, it will be appreciated that this system is further from ideal, as the amplifiers 212 and 210 are now further from being identical, the main amplifier 210 containing combiners whose miss-matches etc. may cause slight changes to the resulting IMD spectrum.

Figure 3:
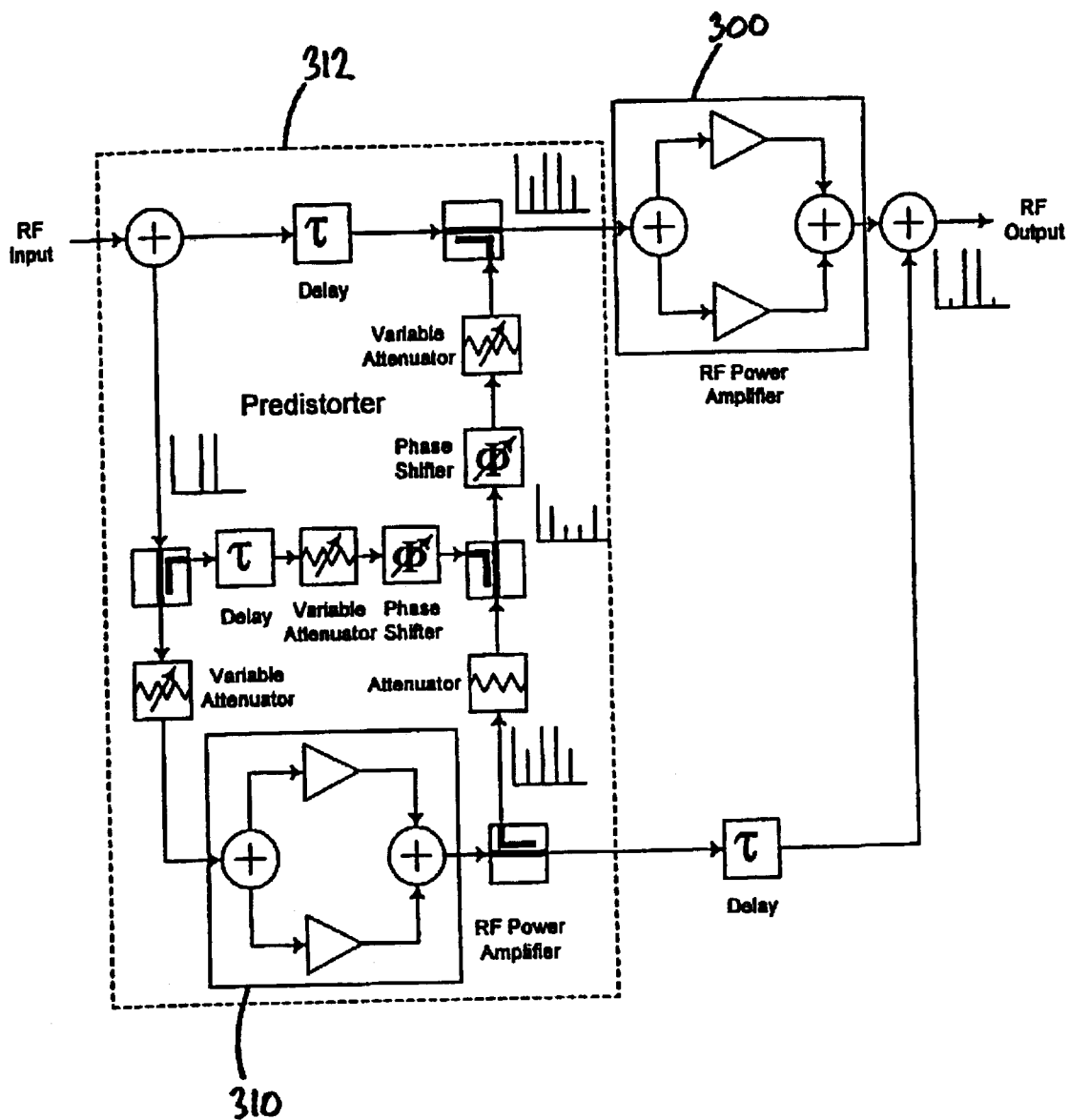
FIG. 3 illustrates another scheme for linearising an RF power amplifier.

An alternative arrangement using combined amplifiers is shown in FIG. 3. In the FIG. 3 system, both the amplifier 300 in the main signal path and the amplifier 310 in predistorter 312 each comprise multiple amplifier modules. In the example shown, each of amplifiers 300 and 310 comprises two identical amplifier modules in parallel and so the system is returned to its ideal state wherein the amplifiers are identical.

Figure 4:
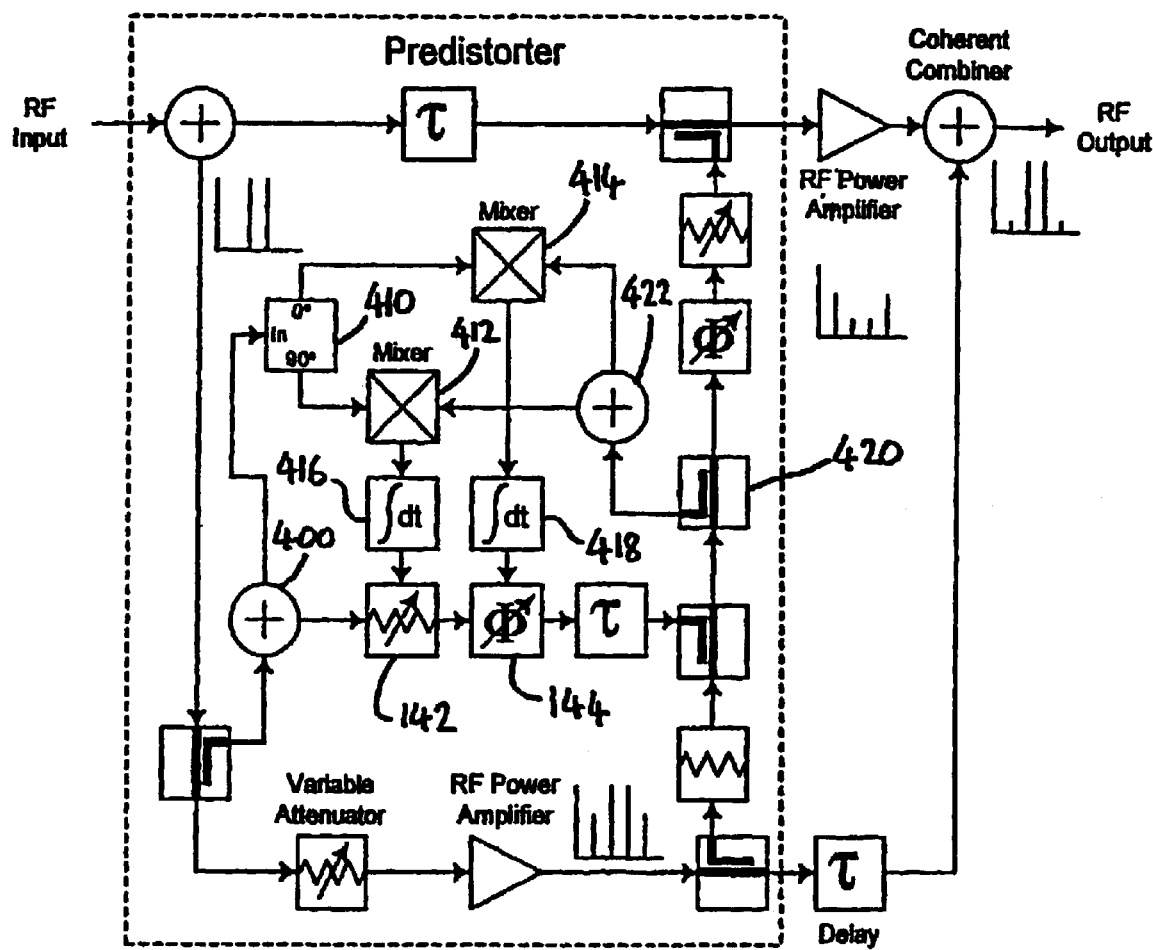
FIG. 4 illustrates yet another scheme for linearising an RF power amplifier.

FIG. 4 illustrates how the main signal component cancellation in the injection path (i.e. path 134 in FIG. 1) can be controlled in the predistorters illustrated in FIGS. 1 to 3. The system shown in FIG. 4 differs from that shown in FIG. 1 by the provision of a splitter 400, quadrature generator 410, mixers 412 and 414, integrators 416 and 418, and splitters 420 and 422. Splitter 400 removes a portion of the input signal sample used in the main signal component cancellation and supplies it to quadrature generator 410, which supplies an inphase version of the input signal to mixer 414 and a quadrature version of the input signal to mixer 412. The other inputs of these mixers are each supplied, via splitters 420 and 422, with a sample of the correction signal from the injection path subsequent to main signal component cancellation. The outputs of mixers 412 and 414 are supplied to integrators 416 and 418 respectively, which produce control signals for the variable attenuator and variable phase shifter in the main signal component cancellation path. The mixers 412 and 414 and integrators 416 and 418 correlate any residual main signal component present in the correction signal with inphase and quadrature reference signals, as sampled by splitter 400. Essentially, this control process operates by performing a quadrature correlation of the correction signal with the main signal itself and to drive the integrator based controllers using the correlation results. These integrator based controllers automatically optimise the gain and phase settings for the variable attenuator 142 and the variable phase shifter 144 so that cancellation of the main signal component is maximised.

It is possible to perform these control operations using a digital signal processor (DSP), with the provision of suitable analogue to digital, and digital to analogue, conversion.

Control of the variable attenuator and variable phase shifter in the injection path (e.g. elements 146 and 148 in FIG. 1) can be achieved in a known manner by monitoring the presence of residual distortion in a feedback signal from the output of the coherent combiner (e.g. 152 in FIG. 1). Such a control scheme could also be implemented by DSP.

What is claimed is:

1. Apparatus for reducing the distortion appearing in an amplified output signal, the apparatus comprising:
    a first sampler adapted to sample, as a sample signal, a portion of the input signal destined for amplification by a first amplifier;
    a second amplifier adapted to amplify the sample signal to produce an amplified sample signal, the distortion characteristics of the second amplifier being at least similar to those of the first amplifier;
    an extractor adapted to extract a distortion signal from the amplified sample signal;
    a first combiner adapted to combine the distortion signal with the input signal destined for amplification by the first amplifier to reduce distortion of the output of the first amplifier; and
    a second combiner adapted to combine the outputs of the first and second amplifiers to produce the amplified output signal;
    wherein the extractor comprises a second sampler adapted to sample the amplified sample signal and a suppressor adapted to remove the amplified input signal appearing in the sample of the amplified sample signal.

2. Apparatus according to claim 1, wherein the first and second amplifiers are substantially the same.

3. Apparatus according to claim 1, wherein the first and second amplifiers each comprise at least one amplification module and there is at least one amplification module in one of the amplifiers which has a substantially identical module in the other amplifiers.

4. Apparatus according to claim 1, wherein the suppressor adapted to remove the amplified input signal comprises a third combiner adapted to combine the sample of the amplified sample signal with the sampled input signal.

5. Apparatus according to claim 1, further comprising an adjuster adapted to adjust parameters of the distortion signal to enhance the reduction of the distortion appearing in the amplified output signal.

6. Apparatus according to claim 1, wherein the distortion signal combined with the input signal to the first amplifier is arranged so as to reduce distortion of the output of the second amplifier in the combined signal comprising the outputs of the two amplifiers.

7. Apparatus according to claim 1, wherein the signals in the apparatus are delayed, as necessary, to provide that the outputs of the two amplifiers combine substantially coherently.

8. A method of reducing the distortion appearing in an amplified output signal, the method comprising the steps of:
    first sampling, as a sample signal, a portion of an input signal destined for amplification by a first amplification process;
    amplifying the sample signal using a second amplification process, whose distortion characteristics are at least similar to those of the first amplification process, to produce an amplified sample signal;
    extracting a distortion signal from the amplified sample signal;
    first combining the distortion signal with the input signal destined for amplification by the first amplification process to reduce distortion of the output of the first amplification process; and
    second combining the outputs of the first and second amplification processes to produce the amplified output signal;
    wherein the step of extracting a distortion signal comprises the steps of second sampling the amplified sample signal and removing the amplified input signal appearing in the sample of the amplified sample signal.

9. Apparatus according to claim 3, wherein the first amplifier comprises two or more amplification modules.

10. Apparatus according to claim 9, wherein the second amplifier comprises two or more amplification modules.

11. Apparatus according to claim 1, wherein the suppressor comprises:
    a third sampler adapted to sample, as a sub-sample signal, a portion of the sample signal destined for amplification by the second amplifier;
    one or more adjusters adapted to adjust one or more parameters of the sub-sample signal; and
    a third combiner adapted to combine the sample of the amplified sample signal with the adjusted sub-sample signal to generate the distortion signal.

12. Apparatus according to claim 11, wherein the one or more adjusters include a variable attenuator and a phase shifter and further comprising control circuitry adapted to control the variable attenuator and the phase shifter.

13. Apparatus according to claim 12, wherein the control circuitry comprises:

a quadrature generator adapted to generate inphase and quadrature versions of the sub-sample signal;

a first mixer adapted to generate a first control signal for the variable attenuator based on the quadrature version; and a second mixer adapted to generate a second control signal for the phase shifter based on the inphase version.

* * * * *